US005620930A

United States Patent [19]

Hey et al.

[11] Patent Number: 5,620,930
[45] Date of Patent: Apr. 15, 1997

[54] TRENCH ETCHING IN AN INTEGRATED-CIRCUIT SEMICONDUCTOR DEVICE

[75] Inventors: Hans P. W. Hey, Phoenix, Ariz.; Kei Yoshida, Allentown, Pa.

[73] Assignee: Lucent Technologies Inc., Murray Hill, N.J.

[21] Appl. No.: 425,734

[22] Filed: Apr. 20, 1995

Related U.S. Application Data

[63] Continuation of Ser. No. 679,163, Mar. 26, 1991, abandoned, which is a continuation of Ser. No. 374,721, Jul. 3, 1989, abandoned.

[51] Int. Cl.$^6$ ................................................. H01L 21/467
[52] U.S. Cl. ........................ 438/421; 438/430; 438/426; 438/433; 438/702
[58] Field of Search ........................... 437/61, 63, 225, 437/228; 148/DIG. 50; 156/657.1

[56] References Cited

U.S. PATENT DOCUMENTS

| | | | |
|---|---|---|---|
| 4,331,708 | 5/1982 | Hunter | 427/93 |
| 4,476,623 | 10/1984 | El-Kareh | 437/63 |
| 4,502,913 | 3/1985 | Lechaton et al. | 437/63 |
| 4,673,962 | 6/1987 | Chatterjee et al. | 357/51 |
| 4,717,448 | 1/1988 | Cox et al. | 156/648 |
| 4,784,720 | 11/1988 | Douglas | 437/241 |
| 4,786,359 | 11/1988 | Stark et al. | 156/643 |
| 4,906,585 | 3/1990 | Neppl et al. | 437/34 |

FOREIGN PATENT DOCUMENTS

| | | | |
|---|---|---|---|
| 0303050 | 2/1989 | Germany | 21/308 |
| 60-241231 | 5/1984 | Japan | H01L 21/76 |
| 63-188952 | 1/1987 | Japan | H01L 21/76 |
| 2111304 | 6/1983 | United Kingdom | 21/461 |

OTHER PUBLICATIONS

European Search Report dated Aug. 19, 1991.

*Primary Examiner*—R. Bruce Breneman
*Assistant Examiner*—R. Paladugu
*Attorney, Agent, or Firm*—John T. Rehberg

[57] ABSTRACT

In the manufacture of semiconductor integrated circuit devices, semiconductor regions such as, e.g., doped regions or tubs are separated by an etched trench which is self-aligned with respect to such regions on account of the presence of an etch-resistant layer overlying the regions during etching. In accordance with preferred processing of the invention a first layer is formed alongside the trench to be etched, a spacer second layer is formed alongside the edge of the first layer, and a third layer is formed abutting the spacer. The spacer is etched away while first and third layers remain in place, and the trench is etched in the space between the first and third layers. A preferred etchant comprises $CF_3Br$ and oxygen.

16 Claims, 2 Drawing Sheets

TRENCH ETCHING IN AN INTEGRATED-CIRCUIT SEMICONDUCTOR DEVICE

This application is a continuation of application Ser. No. 07/679,163, filed on Mar. 26, 1991 now abandoned which is a continuation of application Ser. No. 07/374,721 filed on Jul. 3, 1989 now abandoned.

TECHNICAL FIELD

The invention is concerned with integrated-circuit semiconductor devices and their manufacture.

BACKGROUND OF THE INVENTION

In the field of integrated-circuit semiconductor device technology, processing methods have been developed to produce high yield in the manufacture of intricate device structures. For example, in the manufacture of memory and logic processor devices, including arithmetic units, a so-called complementary metal-oxide-semiconductor technology has been developed, involving p- and n-channel transistors on the same chip; in this respect, see, e.g., U.S. Pat. No. 4,435,896, issued Mar. 13, 1984 to L. C. Parrillo et al., and U.S. Pat. No. 4,554,726, issued Nov. 26, 1985 to S. J. Hillenius et al.

As the trend continues towards increased packing density and device miniaturization in memory- as well as in logic-device structures, increasing concern arises with respect to the physical and electrical isolation of miniature, closely spaced devices on a common semiconductor substrate or chip. One promising isolation approach involves the formation of physical trenches or grooves between devices, such trenches typically being filled with silicon dioxide or with polycrystalline silicon.

For the manufacture of trench structures a variety of methods have been proposed; see, e.g., U.S. Pat. No. 4,104,086, issued Aug. 1, 1978 to J. A. Bondur et al., and the paper by R. D. Rung et al., "Deep-Trench Isolated CMOS Devices", *Technical Digest of the IEDM*, 1982, pp. 237–240 which is more specifically directed to complementary metal-oxide-semiconductor devices.

In the interest of full realization of the space-saving potential of trench isolation, preferred trench width is small and preferably significantly less than design-rule feature size. And, since closely spaced placement of devices is facilitated further by accurate placement of trenches relative to device regions such as, e.g., doped "tubs" in CMOS devices, accurate alignment of trenches with respect to device regions is desired.

SUMMARY OF THE INVENTION

Narrow trenches, preferably having width less than design rule, are formed by etching in integrated-circuit semiconductor devices or chips. Preferably, when such trenches separate differently doped semiconductor regions or tubs, trenches are self-aligned with respect to such regions on account of the presence of etch-resistant layers overlying the regions at least during trench etching.

In accordance with preferred processing of the invention a first layer is formed alongside the trench to be etched, a spacer or fillet second layer is formed alongside the edge of the first layer, and a third layer is formed abutting the spacer. The spacer is etched away while first and third layers remain in place, and the trench is etched in the space between the first and third layers.

A preferred etchant gas mixture for use in reactive-ion trench etching comprises $CF_3Br$ and oxygen.

DETAILED DESCRIPTION

Figure 1:
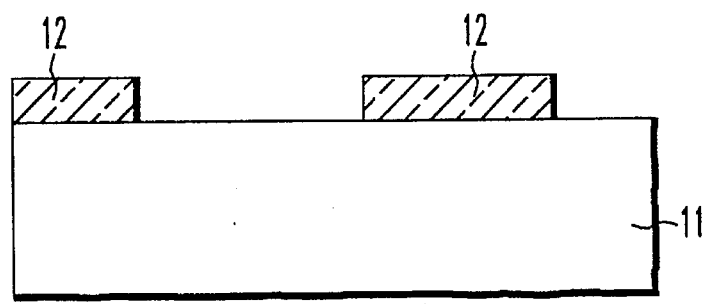
FIGS. 1–7 are cross-sectional schematic representations of a portion of a semiconductor device at sequential stages of exemplary processing in accordance with the invention.

FIG. 1 shows substrate 11, typically consisting of bulk-grown single-crystal silicon, or comprising an epitaxial silicon layer on bulk-grown single-crystal silicon. The use of substrate materials other than silicon (germanium, for example) is not precluded. On substrate 11 a layer 12 has been deposited and patterned so as to leave openings corresponding to areas in which semiconductor devices are to be produced. Layer 12 may comprise silicon dioxide as deposited or, conveniently, as locally grown. One function of such layer 12 may be the local protection of underlying substrate material during later bombardment with a dopant species. Preferred structure of layer 12 has sufficiently sharp edges which preferably are essentially perpendicular to the substrate.

Figure 2:
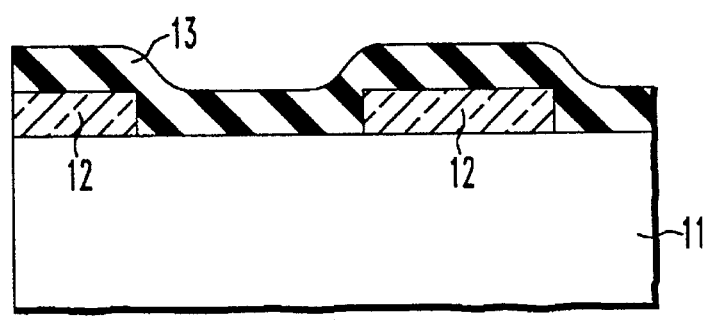

Further to features shown in FIG. 1, FIG. 2 shows an additional deposited layer 13 whose material composition differs from the composition of layer 12, choice of material taking into account, e.g., the availability of an anisotropically acting removal agent for removing layer 13 material without significant removal of layer 12 material. For example, when layer 12 consists essentially of silicon dioxide, silicon nitride represents a suitable choice for layer 13. Methods for the deposition of silicon nitride are well-known in the art; for example, standard low-pressure chemical vapor deposition (LPCVD) can be used to this effect, with dichlorosilane and ammonia as reagents, and as carried out in a tube furnace. Preferred thickness of layer 13 is significantly less than device design rule; e.g., in the case of a 0.9-micrometer design rule, such thickness is in a preferred approximate range from 2000 to 3000 angstroms. An important aspect in the deposition of layer 13 is conformal coverage in the sense that the corner formed between layer 12 and substrate 11 be adequately filled.

Optionally, in the case of silicon nitride as layer 13 material, a thin layer of silicon dioxide may be formed on the structure of FIG. 1 prior to deposition of layer 13; the inclusion of such additional layer enhances adhesion of subsequently deposited silicon nitride, helps to even out interface stress, and can serve as an etch stop. Typical thickness of such silicon dioxide layer is on the order of 200 angstroms.

Figure 3:
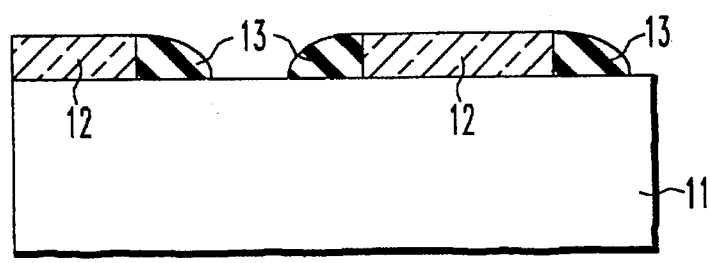

FIG. 3 shows the structure of FIG. 2 after further processing by (anisotropic) back-etching of layer 13 so that remaining layer-13 material forms spacers along the edges of patterned layer 12. Conveniently, in the case of silicon nitride, anisotropic plasma etching with fluorinated chemistry can be used, $SF_6$ being a typical etchant gas for this purpose.

Figure 4:
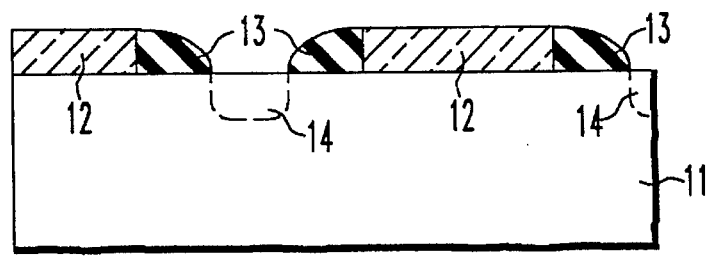

FIG. 4 shows the structure of FIG. 3 after further processing by ion implanting, resulting in the formation of n- or p-doped regions or tubs 14 (tubs being dimensioned to allow for one or several transistors, for example). In the case of silicon, typical n-dopants are P and As; B and Ga can be used for p-doping.

Figure 5:
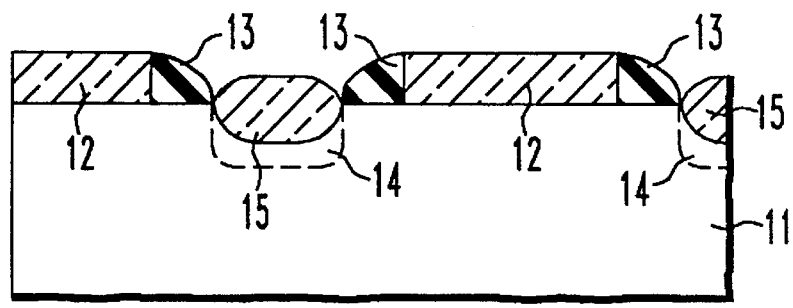

FIG. 5 shows the structure of FIG. 4 after local oxidation, typically carried out at atmospheric pressure or under overpressure, and resulting in the formation of oxide regions 15. Typically, layer 15 has a thickness on the order of 4000 angstroms. Further as a result of oxidation processing, when layer 12 initially consists essentially of silicon dioxide having a thickness in a typical range from 5000 to 10000 angstroms, layer 12 will increase in thickness by about 1000 angstroms.

Figure 6:
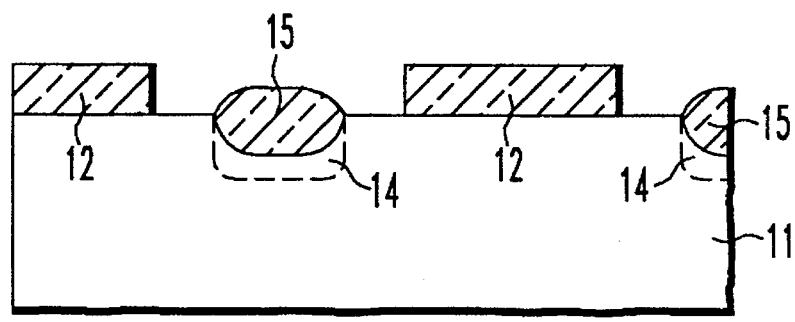

FIG. 6 shows the structure of FIG. 5 after further processing by stripping of the spacer material as may be conveniently effected by wet processing by means of a removal agent which leaves the material of layer 12 substantially unaffected. Alternatively, spacer material may be removed in one and the same operation as also effecting subsequent trench etching.

Figure 7:
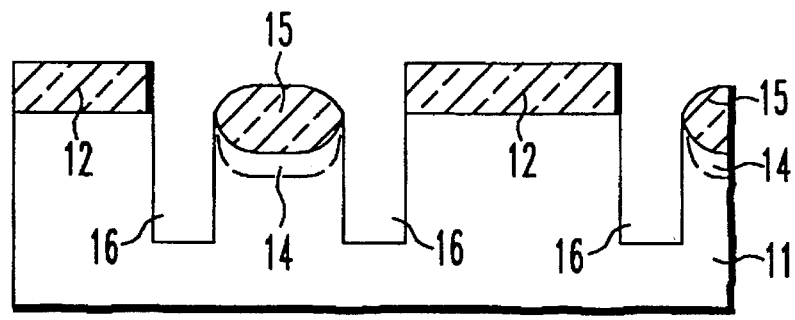

FIG. 7 shows the structure of FIG. 6 after further processing by trench etching, layers 12 and 15 having served as masks, and resulting in etched trenches 16 delimited by the edges of layers 12 and 15. Trench etching can be carried out, e.g., by reactive ion etching in a plasma reactor, e.g., using freon chemistry or fluorinated chemistry ($SF_6$, $CF_4$, $CF_3Br$).

In accordance with a preferred embodiment of the invention, reactive ion etching is carded out with an etchant-gas mixture comprising $CF_3Br$ and oxygen, such reactive-ion etching being more generally applicable for trench etching, and independent of masking steps as described above. Preferred mixtures comprise oxygen in an amount in an approximate range from 1 to 25 percent by volume of $CF_3Br$ and oxygen in combination. Oxygen inclusion was found to contribute to uniformity of etching, to inhibit the formation of so-called black silicon or "silicon grass" at the bottom of trenches, and to produce trenches with slightly tapered sidewalls as is preferred especially when an etched trench will be filled, e.g., with polycrystalline silicon. Taper angle is in a typical approximate range from 2 to 15 degrees from the direction perpendicular to a substrate surface being etched. The inclusion of a diluent or carder gas such as, e.g., helium or argon in the flow in reactive-ion etching apparatus is not precluded.

At this point the structure may be further processed by ion implantation into trenches and/or by trench filling. A preferred sequence includes (thermal) trench sidewall oxidation, followed by deposition of polycrystalline silicon. In this respect, see, e.g., the above-identified paper by Rung et al. Furthermore, oxide regions may now be patterned for the sake of opening up device areas and for electrical contact formation.

Trench formation in accordance with preferred processing of the invention can be used to form CMOS structures, involving one or several steps of dopant implantation. For example, prior to processing as described above, and prior to deposition of layer 12, a step of dopant implanting may be included to form doped regions or tubs under patterned layer 12. Then, if areas 14 are doped opposite, a CMOS structure is readily realized. Also, CMOS structure can be realized even without preliminary ion implantation provided a suitably doped substrate is used.

A sequence of steps similar to the one described above can by used for self-aligned trench formation according to a further embodiment of the invention, with trenches formed along a layer of oxide known as field oxide. Such oxide may have been formed by oxidation in the presence of a silicon nitride mask or preferably, in the interest of edge sharpness, by blanket formation followed by pattern etching.

Further among variants within the scope of the invention is the use of oxide layers 12 and 15 having significantly different thickness, thereby permitting, by means of a further etching step after trench etching, the removal of the thinner of the two layers while leaving a significant amount of the thicker layer in place. Uncovered semiconductor material may then be processed further, e.g., by electrical contact formation.

A similar benefit can be realized by using different materials for layers 12 and 15; for example, on a silicon substrate, layer-12 material may be deposited aluminum oxide, and layer-15 material may be silicon dioxide. Both materials will be resistant to the trench etchant, and, after trench etching, it now becomes possible to selectively remove the one or the other with a suitable etchant. For example, in this fashion, field oxide may remain in place; also, electrical contacts to the semiconductor can be formed, self-aligned with areas uncovered.

Prominent among advantages of trench formation in accordance with the invention is the potential narrowness of trenches, trench width being on the order of the thickness of layer 12. Thus, trench width can be significantly less than the design rule—in device manufacture, the smallest feature size as photolithographically defined. Preferred trench width does not exceed three-fourths of design rule and may readily be made one-half of design rule or less. Thus, in the case of a 0.9-micrometer design rule, trenches have a preferred width of 6750 angstroms or less. Narrow trenches, when used as trench capacitors, e.g., in dynamic random access memory (DRAM) devices, permit closer device spacing, leading to increased device density.

In the following example, all numerically specified quantities are nominal or approximate.

EXAMPLE

On a 5-inch silicon substrate, a silicon dioxide layer was formed 2000 angstroms thick, and an edge pattern was photolithographically defined and etched. A 3000-angstrom silicon nitride layer was deposited and etched by $SF_6$-plasma etching, to leave a spacer layer 2000 angstroms wide, and the remaining silicon surface was oxidized by high-pressure oxidation. The silicon nitride spacers were dissolved, leaving a trench pattern amounting to 50 percent of the substrate surface. Trenches were etched in a Tegal-1500-Series (2-frequency) triode plasma etcher at a chamber pressure of 600 millitorr, with a flow of 3.6 sccm $CF_3Br$ and 0.75 sccm oxygen, and with 500 watts power at 13.56 MHz (generating reactant species) and 200 watts power at 100 KHz (powering ionic bombardment). A trench depth of 2 micrometers was achieved after 2.5 minutes of etching. Micrographic inspection showed trenches 2000 angstroms wide, with a slight taper.

We claim:

1. In the manufacture of a semiconductor integrated circuit device, a method for forming a trench in a body of a semiconductor material comprising the steps of:

forming a patterned first layer on a first portion of said body, said first layer having a terminating edge at the intended location of a first edge of said trench;

forming a spacer on a second portion of said body, said spacer abutting said first layer along said terminating edge, the width of said spacer being essentially the intended width of said trench, an edge of said spacer thereby defining the location of a second edge of said trench;

forming an oxide region on said body abutting said spacer;

selectively removing said spacer; and etching said trench.

2. The method of claim 1 in which said spacer is formed by conformal deposition across the terminating edge of said first layer, followed by anisotropic etching.

3. The method of claim 1 in which said first layer and said oxide region consist essentially of the same material.

4. The method of claim 1 in which said body of semiconductor material consists essentially of silicon.

5. The method of claim 4 in which said body of semiconductor material comprises an epitaxially deposited silicon layer.

6. The method of claim 4 in which said first layer comprises silicon dioxide.

7. The method of claim 4 in which said first layer comprises an aluminum oxide.

8. The method of claim 4 in which said spacer comprises silicon nitride.

9. The method of claim 8 in which, prior to deposition of said spacer, a layer of silicon dioxide is deposited.

10. The method of claim 1, further comprising a step of doping said trench.

11. The method of claim 1, further comprising a step of filling said trench.

12. The method of claim 11 in which the sidewalls of said trench are oxidized, and in which said trench is filled with polycrystalline silicon.

13. The method of claim 1, further comprising a step of patterning said oxide region.

14. The method of claim 1, in which said first layer and said oxide region have different material composition, and said method further comprising a step, after trench etching, of etching said first layer and said oxide region.

15. The method of claim 1, in which said first layer and said oxide region have different thickness, and said method further comprising a step, after trench etching, of etching said first layer and said oxide region.

16. The method of claim 14 or 15, further comprising a step of electrical contact formation on uncovered semiconductor material.

* * * * *